United States Patent [19]

Leas

[11] Patent Number: 4,901,329
[45] Date of Patent: Feb. 13, 1990

[54] INTEGRATED LASER ARRAYS AND SUPPORT CIRCUITS

[75] Inventor: James M. Leas, Bethesda, Md.

[73] Assignee: International Business Machines Corporation, Armonk, N.Y.

[21] Appl. No.: 344,553

[22] Filed: Apr. 25, 1989

Related U.S. Application Data

[63] Continuation-in-part of Ser. No. 264,422, Oct. 31, 1988, abandoned.

[51] Int. Cl.$^4$ .............................................. H01S 3/19
[52] U.S. Cl. ....................................... 372/50; 357/17; 350/96.11; 372/44
[58] Field of Search ............... 357/17, 19, 72; 372/36, 372/44, 49, 50, 108; 350/96.11, 96.12

[56] References Cited

U.S. PATENT DOCUMENTS

| | | | |
|---|---|---|---|
| 4,111,521 | 9/1978 | Streifer et al. | 350/96.13 |
| 4,360,921 | 11/1982 | Scifres et al. | 372/50 |
| 4,578,793 | 3/1986 | Kane et al. | 372/94 |
| 4,661,962 | 4/1987 | Clayton | 372/50 |
| 4,695,859 | 9/1987 | Guha et al. | 357/19 |
| 4,720,834 | 1/1988 | Yamamoto et al. | 372/45 |
| 4,730,325 | 3/1988 | Chow | 372/44 |
| 4,736,231 | 4/1988 | Ayabe et al. | 357/19 |
| 4,743,091 | 5/1988 | Gelbart | 350/252 |
| 4,750,185 | 6/1988 | Maei et al. | 372/50 |
| 4,750,799 | 6/1988 | Kawachi et al. | 350/96.11 |
| 4,751,707 | 6/1988 | Krebs et al. | 372/44 |
| 4,765,819 | 8/1988 | Kersten et al. | 350/96.12 |

OTHER PUBLICATIONS

"Monolithic GaAs/AlGaAs diode laser/deflector devices for light emission normal to the surface", to Windhorn and Goodhue, *Applied Physics Letters* 48 (24), Jun. 16, 1986.

"Large monolithic two-dimensional arrays of GaInAsP/InP surface-emitting lasers" to Liau and Walpole, *Applied Physics Letters* 50 (9), Mar. 2 1987.

"Surface-emitting GaInAsP/InP laser with low threshold current and high efficiency", to Laiu and Walpole, *Applied Physics Letters* 46 (2), Jan. 15, 1985.

"Monolithic two-dimensional arrays of high-power GaInAsP/InP surface-emitting diode lasers", to Walpole and Liau, *Applied Physics Letters* 48 (24), Jun. 16, 1986.

"High-performance InGaAsP/InP buried-heterostructure lasers and arrays defined by ion-beam-assisted etching", to Yap, Liau, Tsang and Walpole, *Applied Physics Letters* 52 (18), May 2, 1988.

IBM *Technical Disclosure Bulletin*, vol. 23 No. 5, Oct. 1980, pp. 2164-2165, to Comerford, entitled "Total Internal Reflection End Mirror Laser Diode."

IBM *Technical Disclosure Bulletin*, vol. 20 No. 4, Sep. 1977, p. 1606, to Comerford and Crow, entitled "Offset Laser to Groove Waveguide Coupler".

IBM *Technical Disclosure Bulletin*, vol. 22 No. 1, Jun. 1979, p. 401, to Hung and Small, entitled "Integrated Light-Emitting Devices with Silicon LSI Circuits".

*Primary Examiner*—James W. Davie
*Attorney, Agent, or Firm*—Jeffrey S. LaBaw

[57] ABSTRACT

A two dimensional, surface-emitting array of semiconductor lasers. Lasers disposed on a semiconductor substrate emit light in a direction substantially parallel to the substrate surface into a high index material in which the lasers are embedded. Internal reflectors composed of a low index material, also embedded in the high index material, reflect the laser beams to the surface of the array. The indexes of the low index material and the high index material are chosen so that none of the light enters the internal reflector, and all light is reflected to the laser array surface.

26 Claims, 5 Drawing Sheets

INTEGRATED LASER ARRAYS AND SUPPORT CIRCUITS

This application is a continuation-in-part of U.S. Ser. No. 07/264,422 filed Oct. 31, 1988, now abandoned.

BACKGROUND OF THE INVENTION

This invention generally relates to semiconductor laser arrays and more particularly, to a semiconductor laser array and a method of forming the laser array where the laser beams emitted are directed perpendicular to or parallel along the surface of the chip by the use of a high index material.

Semiconductor laser arrays and laser lines have many potential applications including high power sources to pump solid state lasers and a variety of optoelectronic applications. Much of the current effort in laser arrays is devoted to linear arrays of edge-emitting GaAs/AlGaAs lasers, fabricated by growing AlGaAs alloy layers on a GaAs substrate and cleaving the GaAs substrate at both ends of the lasers to form the two laser mirrors of the resonant cavity. Several lasers or a row of lasers may be formed together by this process. Limited success has been experienced in fabricating two-dimensional arrays of lasers by stacking and joining several discrete linear laser arrays formed by such cleaving techniques together.

Other efforts include building monolithic two-dimensional laser arrays which have been fabricated as a grid of semiconductor devices which emit laser beams perpendicular to the surface of the chip. Prior art devices in this category include arrays which use lasers with their resonant cavities normal to the wafer surface, arrays with chemically etched 45° mirrors or arrays utilizing a second order grating coupler. However, the efficiencies of most of these prior art lasers were too low to be of practical interest. A more promising technique is to use devices formed by coupling edge emitting laser diode with external mirrors formed by etching 45° parabolic or slant mirrored surfaces on the chip. This technique is described in an article by T. H. Windorn and W. D. Goodhue, entitled "Monolithic GaAs/AlGaAs Diode Laser/Deflector Devices for Light Emission Normal to the Surface," Appl. Phys. Lett. 48 (24), 16 June 1986.

There are, however, several problems with the prior art which limit the power, size and manufacturability of two-dimensional laser arrays.

Forming the mirrors of the resonant cavity by cleaving is suitable for the fabrication of a linear array of lasers. However, in a linear array, the narrow shape of the substrate formed by cleaving sharply limits the location and amount of support circuitry and wiring that can be integrated in the laser substrate. Support circuitry such as laser control logic, memory devices, decoders, input-output ports and power supplies can only be accommodated on the two remaining sides of the laser. Whether these support devices are most ideally placed adjacent to the laser or at the periphery of the substrate, the cleaved mirror technique presents severe obstacles to the chip designer. Another problem with the cleaving technique is that electrical testing of the devices cannot be performed until the laser chips are mounted in their packages.

While limited success has been experienced in fabricating two dimensional arrays from a series of cleaved linear laser arrays, these arrays share all of the same problems of the linear arrays and add some new ones of their own. Discrete wires are used to interconnect the stacked laser arrays. The numerous external electrical connections raise considerable reliability concerns when compared to the interconnecting metallurgy used on an integrated chip. In addition, interference among the laser beams determines the light pattern of the laser array, and as the interference pattern is in part determined by the position of the lasers, the positioning of the lasers within the array must be precise. It is quite difficult to form an array of stacked lasers, consequently the positioning of the laser elements within the array can vary significantly from array to array.

A monolithic two dimensional laser array avoids some of the problems inherent in cleaving the substrate to form laser mirrors allowing greater freedom in locating support devices and greater precision in the positioning of laser elements in the array. However, the 45° parabolic or slant mirrors used in the prior art are formed by depositing a reflecting metal film on the slanting surface on the substrate. Mirror reflection is not 100 percent efficient and particularly at some wave lengths of light, significant power is lost at the mirrored surface. As a result, in addition to losing light output, the heat which must be dissipated by the chip is higher. One of the major problems limiting the size of the laser array is that it becomes progressively more difficult to remove waste heat as the size of the array increases. It would be clearly advantageous to eliminate the power loss at the mirror surface. Other problems in using metallic mirror surfaces include potential corrosion concerns, and mechanical problems including difficulties of attaching optical fibers to mirror reflectors mounted at a sloping angle.

Topology concerns play a significant factor in fabricating large laser arrays. Using current deposition methods, the laser can be significantly higher than the substrate on which it is situated. The side edges of the lasers present sharp topographical features to the overlying interconnecting metallurgy. To reduce yield and reliability problems, a gradually sloping spacer can be included at the side edges of the laser. However, these sloping spacers use up chip area, reducing laser and circuit packing density. All of these factors pose problems in achieving functional and reliable metalization connecting support circuit elements on the supporting substrate adjacent to the laser.

SUMMARY OF THE INVENTION

It is an object of the present invention to provide an improved laser array on a semiconductor substrate which emits laser beams perpendicular to the surface of the substrate.

It is another object of the present invention to provide an improved two dimensional laser array with a smooth topological surface suitable for interconnecting lasers and circuit elements.

It is another object of the present invention to transmit the light out of the laser array with minimal Fresnel and scattering losses.

It is another object of the present invention to integrate the improved laser array with one or more optical fibers.

It is yet another object of the present invention to reduce power loss at the mirror reflector.

These and other objects of the invention are accomplished by embedding the laser in a high index material, providing the high index material as the light path connecting the laser and the surface of the chip, and to use an internal reflector having a slanted surface and composed of a low index material to produce the required amount of deflection of the laser beam by total internal reflection so that the beam emerges from the surface of the array with minimal loss of light.

In the preferred embodiment of the invention, four optical surfaces are formed at each laser element: two laser mirrors which define the resonant cavity, a 45° total internal reflector structure adjacent to the output facet of the laser, and an optically flat surface at the array surface above the internal reflector. The internal reflector is much more efficient than a mirrored surface since the high and low index materials are chosen so that 100% of the beam is deflected at a 90° angle at the interface of the materials, no light is lost by transmission through the low index material. The process of the invention is designed to avoid damage to each optical surface as subsequent process steps are performed and optical surfaces are formed.

In an alternate embodiment of the invention, two 45° internal reflector structures are used, one at either facet of the laser as both facets are designed to emit a laser beam. Thus, in the alternative embodiment, two laser beams are produced by each laser element, and five optical surfaces are formed at each element. By dividing the beam in two, a greater total power output by each laser element can be maintained.

The foregoing and other objects, features and advantages of the present invention will be made more apparent from the following description of the preferred embodiments.

BRIEF DESCRIPTION OF THE DRAWINGS

The accompanying drawings, illustrate one embodiment of the invention and together with the description, serve to explain the principles of the invention.

DETAILED DESCRIPTION OF THE DRAWINGS

Figure 1:
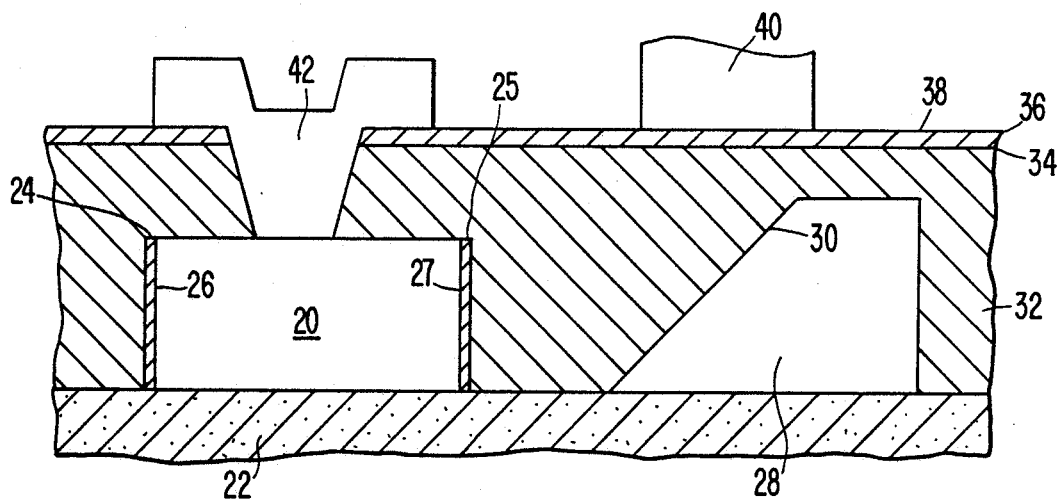
FIG. 1 shows a cross sectional view of the laser, the substrate, and related reflecting surfaces.

Referring to FIG. 1, a cross section of an individual AlGaAs laser 20 along the axis of the laser beam is shown. The laser 20 consists of a series of very thin crystalline layers of AlGaAs grown epitaxially on a GaAs substrate 22. The total thickness of these layers is approximately 3 um. The resonant cavity is formed by twin polished reflecting surfaces 24 and 25. The reflecting surfaces 24 and 25 are capped by mirrors 26 and 27, which may be a metallic layer, or may be a dielectric layer such as an alumina or a silicon nitride layer deposited in a conformal thickness equal to one quarter or one half wave length of the laser light generated by the laser 20. The choice of material at reflecting surfaces 24 and 25 is dependent on the degree of reflectivity desired at each interface. If a metallic layer is used the reflectivity is determined by the thickness of the layer. In the preferred embodiment, only one laser beam is produced by each laser element 20. Thus, it is desirable to have a highly reflecting surface at surface 24 and a highly transmissive surface at output surface 25. Together with the slanted internal reflector 28 which is formed out of a low index material such as $SiO_2$, the laser 20 is embedded in a layer of high index material 32 such as $TiO_2$ which is slightly thicker than the laser 20 itself. The surface 34 of the high index material 32 is polished to provide an optical surface which has the additional benefit of being a planar surface for interconnecting metallurgy. The high index material 32 is capped by an antireflective coating 36, which promotes better optical coupling between the laser 20 and the optical fiber 40 and reduces Fresnel losses out of the chip.

When a small voltage is applied to the laser 20 via the electrical contact 42, electric current flows and carriers, electrons and holes, are injected into the active region of the laser 20. Upon recombining, the carriers generate light; optical feedback in a direction parallel to the surface of the substrate 22 is produced by the reflecting surfaces 24 and 25. Light is emitted from the surface 25 into the high index material 32. The angle and indexes of refraction of the internal reflector 30 and high index material are chosen to deflect the light perpendicularly so that the laser beam emerges from the chip surface 38. A waveguide or optical fiber 40 may also be attached to the surface 38 of the antireflective coating 36, or to the high index material 32 if the antireflective coating 36 is omitted, for each laser 20 or to combine the light of the entire array.

In an alternative embodiment, a second slanted internal reflector like reflector 28 is placed opposite surface 24. Both surface 24 and 25 are transmissive rather than reflective surfaces, resulting in two laser beams being produced by each laser 20. Both beams of light would be emitted normal to the chip surface 38.

Figure 2:
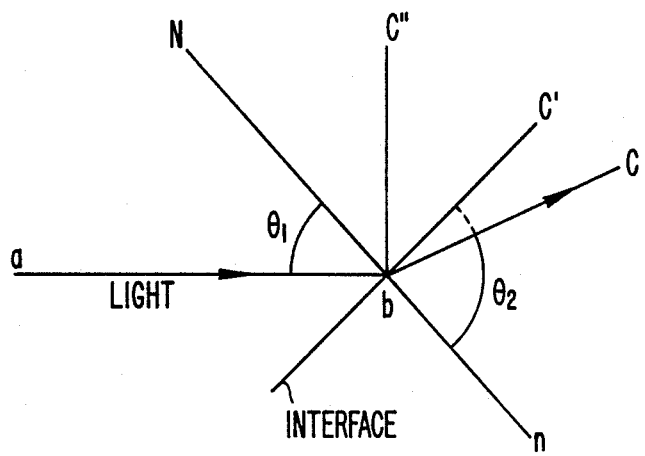
FIG. 2 shows the relationship between the angles of incidence and refraction of the laser beam at the interface of the high index material and the internal reflector.

One of the key features of a laser array built according to the present invention is the use of the high index material 32 in combination with the slanted surface of the internal reflector 30 which is formed from a material with a substantially lower index of refraction. As this relationship is critical for implementing the invention, the following discussion is provided:

The index of refraction of a material is defined as the ratio of speed of light in air to the speed of light in the material. Light will travel slower in a high index material than in a low index material. Because of the difference in speed, the direction of a light wave changes when it crosses the interface between materials of different indexes of refraction. Referring to FIG. 2, the angle of incidence abN and the angle of refraction nbc are related to the indexes of refraction by Snell's law which states:

$$\frac{n_1}{n_2} = \frac{\sin \theta_2}{\sin \theta_1}$$

Where $n_1$ equals the index of refraction of the first higher index material, $n_2$ the index of refraction for the second lower index material, $\sin \theta_1$ equals the angle of incidence (abN) and $\sin \theta_2$ equals the angle of refraction nbc of the light after it strikes the interface. If light traveling in a material strikes an interface with a second material of lower index and at an angle of incidence equal to or greater than the "critical angle", none of the light will penetrate across the interface to enter the second material. In other words, the critical angle is that angle of incidence for which of the angle of refraction is 90°. At angles greater than the "critical angle", all of the light will be reflected back into the first material at an angle equal to the angle of incidence. In FIG. 2, the laser beam would travel in the high index material along the path ab, hit the interface between the high index and low index material at point b, and resume its passage in the high index material along path bc''.

In the case of the preferred embodiment as illustrated in FIG. 1, the angle of incidence is 45°, and therefore the critical angle must be 45° or less to achieve total internal reflection. Substituting these values into Snell's Law yields:

$$\frac{n_1}{n_2} \geq 1.414$$

so that the high index material 32 must have an index of refraction equal to or greater than 1.414 times the index of refraction of the material which makes up the internal reflector 28. For example, if $SiO_2$, which has an index of refraction of 1.46, were used for the internal reflector 28, then the high index material must have an index of refraction greater than 2.06. Other low index transparent materials such as NaF, LiF and MgF have indexes of refraction in the range 1.32 to 1.38. Using these materials to build the internal reflector 28, the high index material can have an index as low as 1.9. In addition, if the particular application can tolerate laser beams which do not emerge exactly normal from the surface of the chip, but at some lesser angle, the slant on the internal reflector can be less than 45°. Less of a difference would be required between the indexes of refraction of the low and high index material if the internal reflector 28 were slanted at 30° from the substrate rather than 45°. On the other hand, where a curved surface 30 is used in the internal reflector 28, to focus the laser beam, greater differences between the indexes of refraction of the high and low index materials would be necessary since the light striking at the upper half of a curved surface would strike at an interface with an angle of incidence less than 45 degrees.

The process of fabricating the present invention will be described hereinbelow with particular reference to the use of AlGaAs on a GaAs substrate to form an individual laser device is shown in FIGS. 3A through 3H. It should be understood that other solid state laser structures and materials, such as the InGaAlP/GaAs and InPGaAs/InP systems, can also be used in accordance with the present invention. While the invention is described in terms of a preferred embodiment, it is not limited to any particular structure, combination of materials, set of thicknesses, or sequence of layers.

Figure 3A:
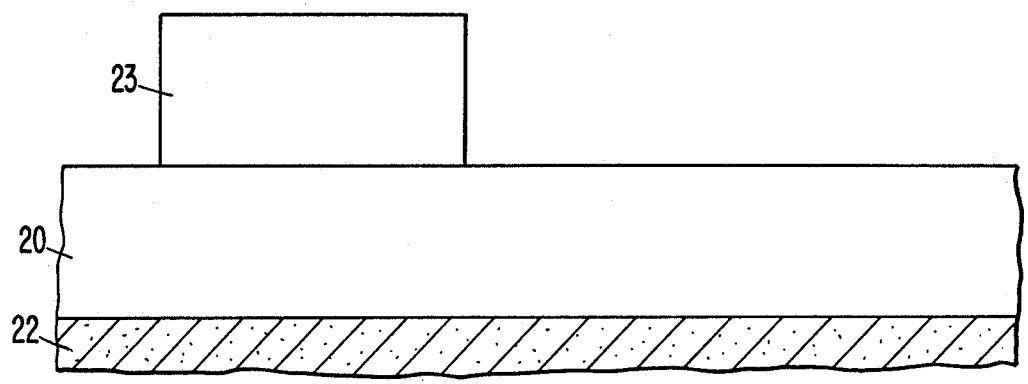
FIGS. 3A through 3H are sectional views, dimensionally exaggerated, of the chip showing process steps for the fabrication of the laser device shown in FIG. 1.

Referring to FIG. 3A, epitaxial AlGaAs layers which form the laser 20 are deposited on the GaAs substrate 22. In one embodiment, these layers include a first layer of $Al_{0.4}Ga_{0.6}As$ with a thickness of 3.3 microns, an intermediate layer of $Al_{0.1}Ga_{0.9}As$ with a thickness of 0.15 microns, and an upper layer of $Al_{0.4}Ga_{0.0}As$ with a thickness of 1.3 microns. Those skilled in the art would understand that the thickness of the AlGaAs layers and the mole fraction of Al, Ga and As in those layers can be varied to produce a particular desired wavelength of light. In the AlGaAs system, the range of achievable wavelengths is between 680 and 860 nm. Suitable methods for the formation of the AlGaAs layers include liquid phase epitaxy, vapor phase epitaxy, and molecular beam epitaxy. A layer of photoresist is applied, exposed and developed to leave a photoresist mask 23 over the laser area.

Along with the laser 20, other circuit elements, such as transistors, diodes, capacitors and resistors (not shown), may also be formed in the substrate 22. Because of the monolithic nature of the laser array of the present invention, other circuit elements may be located on all four sides of the structures shown according to the preferences of the circuit designer. Integrating these support devices may add substantially to process complexity necessary to fabricate the overall monolithic laser array. However, these devices are outside the boundaries of the present invention.

Figure 3B:
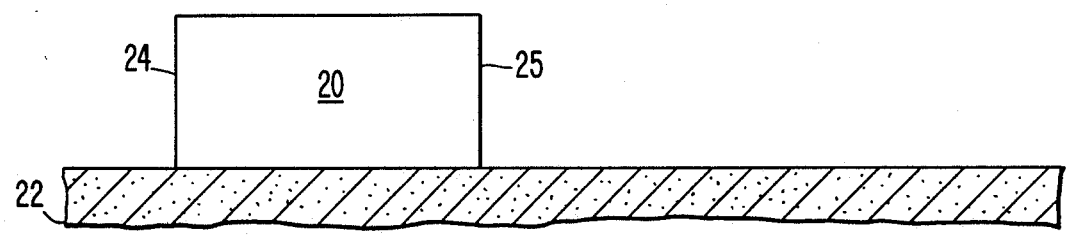

As shown in FIG. 3B, the laser 20 is formed using a recently developed process, Reactive Ion Beam Assisted Etching (RIBAE), which is also called Chemical Assisted Ion Beam Etching in the prior art. RIBAE is used to remove the AlGaAs layers stopping at the GaAs surface. After RIBAE, the remaining photoresist is stripped; the result is the structure seen in FIG. 3B, which shows one of the laser devices 20 in the laser array.

In RIBAE, the substrate is placed in the evacuated chamber of Reaction Ion Beam Etcher such as the Varian Re-480, an argon ion beam is directed to the substrate surface and a reactive gas is flowed over the substrate. Typically, chlorine ($Cl_2$) is used as the reactive gas to etch AlGaAs. Typical process parameters would be 500 ev argon ions at approximately 0.40 $mA/cm^2$ current density and, 14 sccm $Cl_2$ flowing over the substrate. The RIBAE process forms mirror surfaces 24 and 25 nearly as smooth as cleaved surfaces. Other processes which chemically or mechanically form an optically smooth surface may also be used to form the laser 20, including selective chemical etching and mass transport.

Figure 3C:
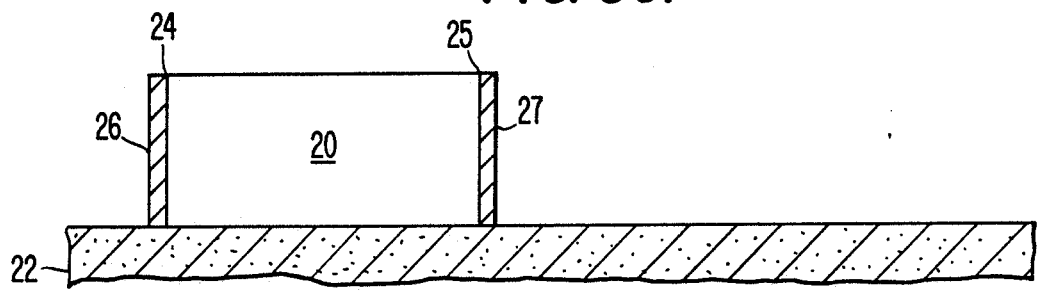

Referring to FIG. 3C, the laser missors 26 and 27 are formed on the smooth optical surfaces 24 and 25 of the laser. Chemical vapor deposition (CVD) may be used for a dielectric material such as $Si_3N_4$ or $Al_2O_3$. While other methods of deposition may be possible, the CVD process is preferred as it provides a very uniform and controlled layer of deposition material. Alternatively, partial or full metal reflectors, such as aluminum, gold or platinum, may also be deposited using evaporation techniques or CVD processes using an organometallic vapor as a source. The material and its thickness may be selected to enhance reflection or to enhance transmission. If output from only one end of the laser 20 is being used as in the preferred embodiment, an antireflective coating such as a quarter wave plate of dielectric material 27 is formed at surface 25 and a reflective coating 26 such as gold is evaporated on surface 24. If the output from both sides is used, partially reflective coatings 26 and 27 are applied to both surfaces 24 and 25. In the process used for illustrative purpose, it is important that the materials used for laser coatings 26 and 27 be impervious to HF since HF will be used in a subsequent processing step. However, it is possible to use other etchants or etching techniques to fabricate a laser array according to the present invention.

Figure 3D:
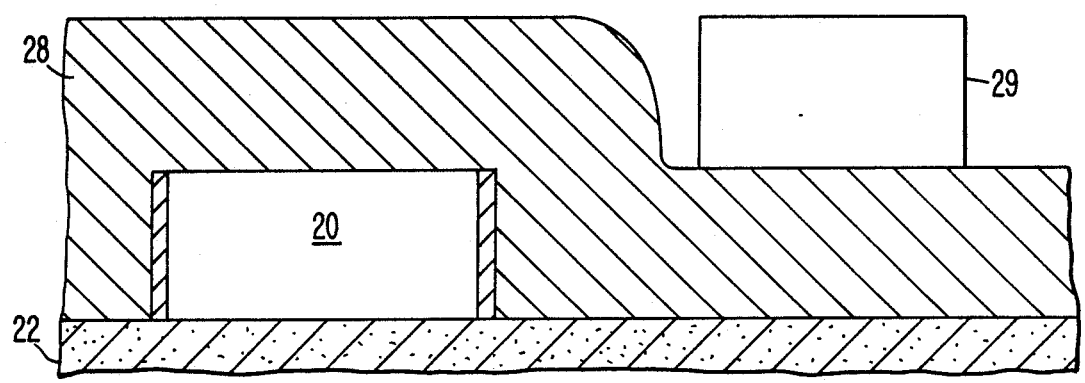

As shown in FIG. 3D, a film 28 of low index material such as SiO2, is then deposited by chemical vapor deposition. The film 28 should be approximately equal in thickness to the laser 20. A 45° angle structure is then formed in two masking steps. In the first masking step shown in FIG. 3D, photoresist is applied and developed away all areas from other than where the internal reflector 28 is to be located forming photoresist mask 29. Next, the bulk of the SiO2 is etched away from the laser using HF, a wet chemical etch process while the SiO2 which will form the internal reflector 28 is protected by photoresist mask 29.

Figure 3E:
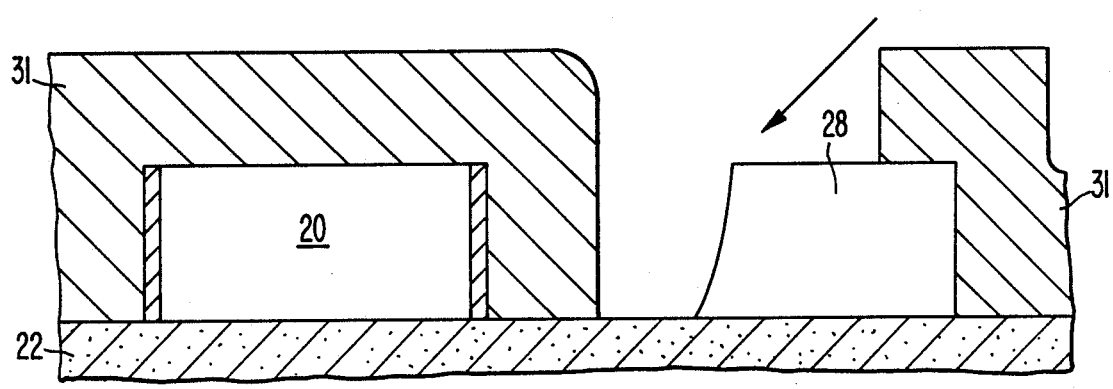
Figure 3F:
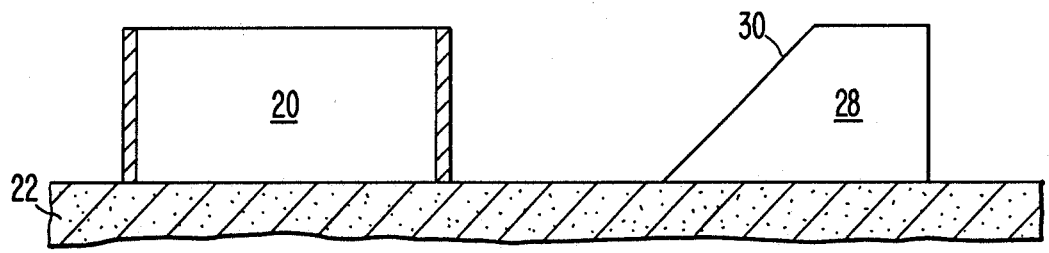

As shown in FIG. 3E, photoresist mask 29 is removed and the second masking step is performed: resist is applied, developed and exposed to leave photoresist pattern 31 so that the laser mirrors 26 and 27 are protected. The wafer is tilted with respect to the ion beam to achieve the 45° angle of the internal reflector and RIBAE as the etching process. In an alternate embodiment, the wafer tilt may also be adjusted during the RIBAE process to produce a curved surface which will bring the laser beam to a focus. The remaining resist is stripped and resulting structure is shown in FIG. 3F.

Figure 3G:
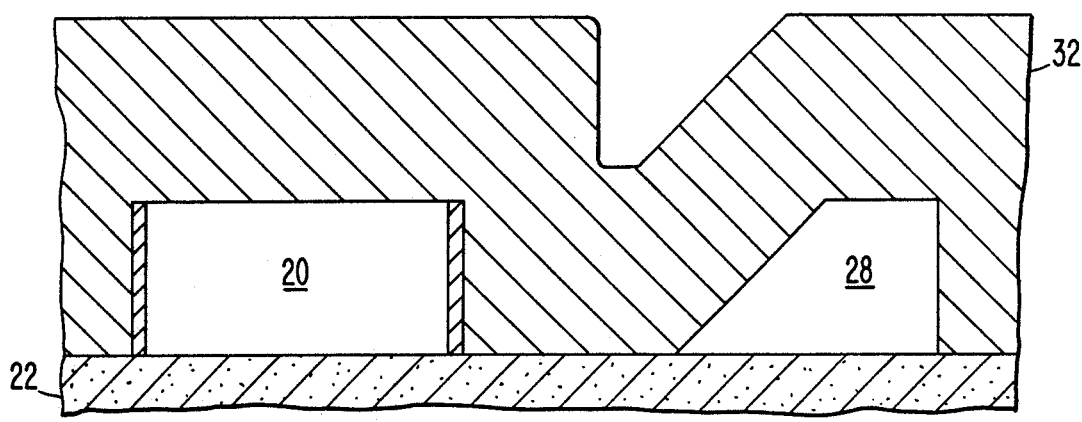

As shown in FIG. 3G, a high index transparent material 32, such as $TiO_2$, $Ta_2O_5$, $Si_3N_5$, ZnS, or SiC is deposited using chemical vapor deposition. As shown in FIG. 3G, the layer 32 conforms to the topology of the existing structures. The layer 32 of high index material deposited must be significantly thicker than the laser and the low index 45° angle structure to allow for subsequent planarization. The high index material 32 is ideally thick enough to accommodate the height of any support circuitry (not shown) which might be present on the substrate 22.

Figure 3H:
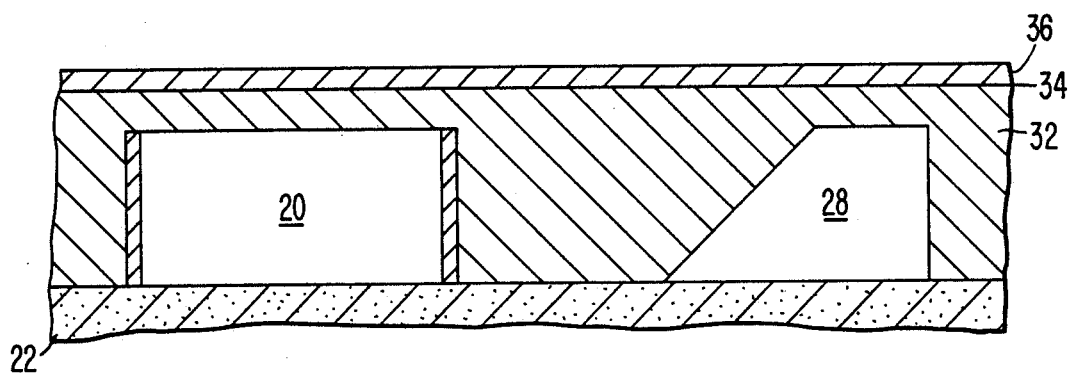

As shown in FIG. 3H, the wafer is mechanically or chemically-mechanically polished to eliminate all topological features leaving an optically flat surface 34. RIBAE or other ion beam milling techniques can produce an optically flat surface, but require more expensive tooling and greater process time. A quarter wave anti-reflective plate 36 of a low index material such as $Al_2O_3$ or $MgF_2$ can be applied to the polished surface to reduce Fresnel power loss. The low index material may be deposited by evaporation, chemical vapor deposition, or other processes. The material used for the quarter wave plate 36 should be intermediate between that of the high index material 32 and the air. If an optical fiber 40 is used, it should be intermediate between the high index material 32 and the optical fiber 40.

As shown in FIG. 1, a metal contact 42 may be attached to the surface of the chip to connect the lasers and other circuit elements. First, a via is etched through the materials covering the laser 20. Then, the metal contact 42 is formed on the via by well known lift-off or metal etch processes. Also as shown in FIG. 1, optical fibers 40 may be attached to the surface of the laser chip.

The indices of refraction of typical high index materials are presented in the table below:

| Material | Index of Refraction |
|---|---|
| $Si_3N_5$ | 1.9–2.1 |
| $Ta_2O_5$ | 2.1–2.3 |
| ZnS | 2.3–2.4 |
| $TiO_2$ | 2.3–2.6 |

The internal reflector 28 may be formed out of SiO2, which has an index of refraction of 1.46, significantly lower than the above listed indices. For example, the critical angle for a $TiO_2$-$SiO_2$ interface is 39°; thus light will be totally reflected from the 45° SiO2 surface. Small variation in the angle of the low index surface 30 may be used, including providing curvature to bring the beam to a focus. As stated above, a variety of films can be used to form the laser mirrors 26 and 27, depending on the desired amount of reflection and transmission. A sufficiently thick layer of metal provides a highly reflective laser mirror. Another possible choice for a highly reflective mirror would be a dielectric film with an appropriate index of refraction. Highly transmissive films would include high index materials such as those listed above. Since HF does not attack GaAs, when it is used to form the internal reflector 28, see FIG. 3, no laser mirrors 26 and 27 are required if transmission from the laser 20 is to be maximized. Partially reflective materials would include a thin metal film, although absorption losses make it a less desirable choice than a thin dielectric film of a thickness and index of refraction chosen for maximum interference effects.

Figure 4:
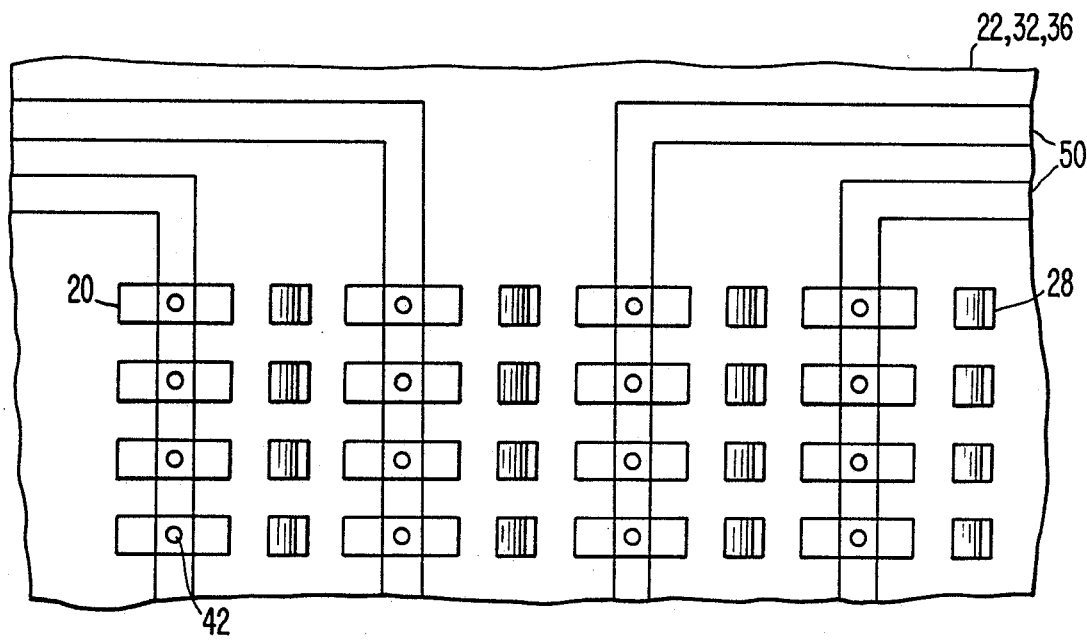
FIG. 4 shows a top view of a laser array built in accordance with the present invention.

FIG. 4 shows a top view of the laser array. Each laser 20 is shown with a single internal reflector 28. Transparent layers of the high index material 32 and the antireflective layer 36 cover the entire array. As shown in FIG. 3, all lasers 20 in each row are wired in parallel by interconnecting lines 50 so that all the lasers 20 in a particular row will be either "on" or "off". If independent control of each laser is desired, each laser 20 could be wired individually as the metal contacts 42 can contact the top surface of the laser 20 at any point on its length.

Figure 5:
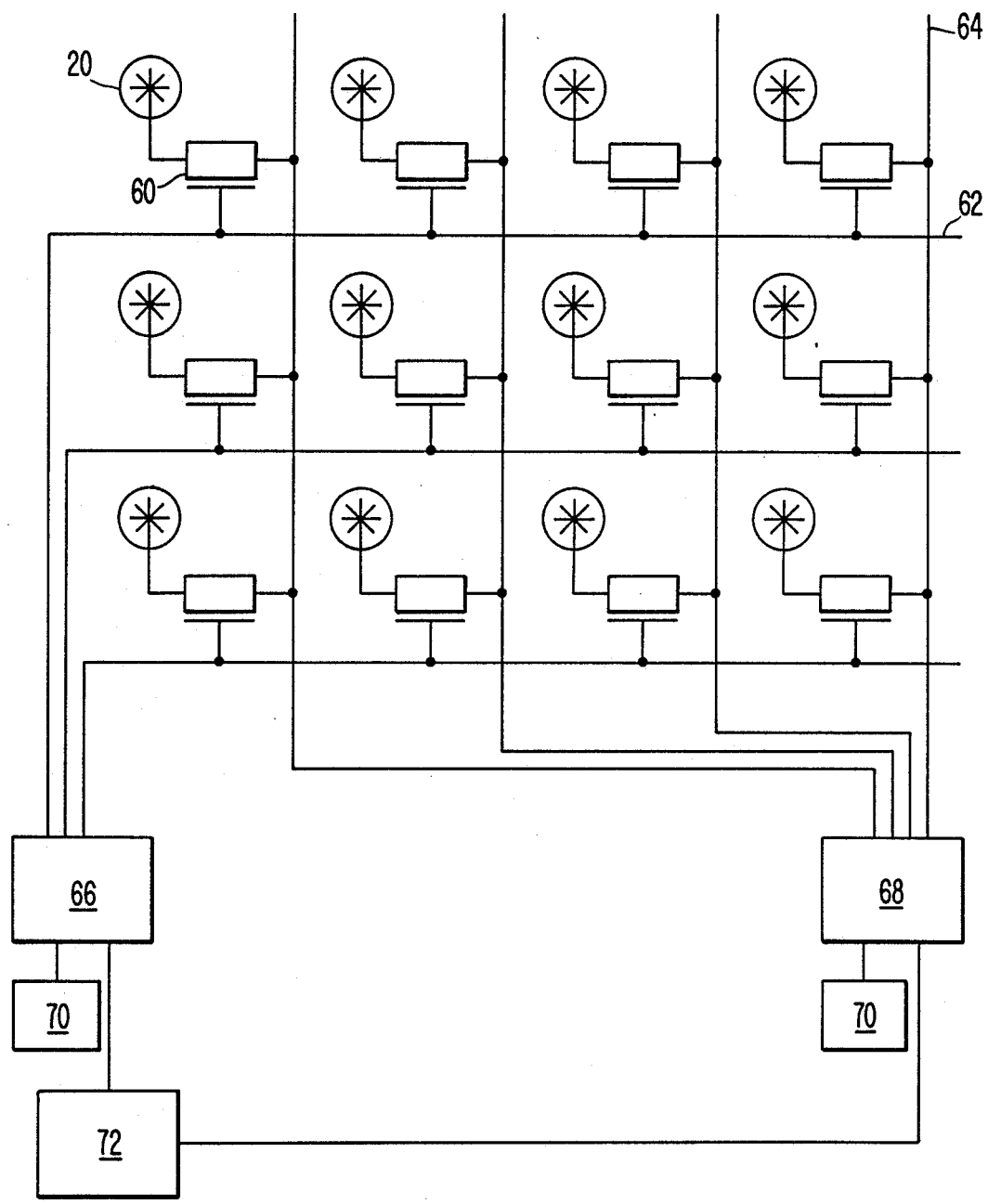
FIG. 5 is a wiring diagram of a laser array and attendant supporting circuitry.

It is also possible to include support circuitry in the laser array. FIG. 5 is a wiring diagram of laser array in which each individual laser 20 is wired to a corresponding transistor 60. When both the row 62 and the column 64 is powered, the transistor 60 switches on powering the laser 20. The laser array also has standard elements such as row and column decoders 66 and 68, I/Os 70 and connections to power supply 72.

Figure 6:
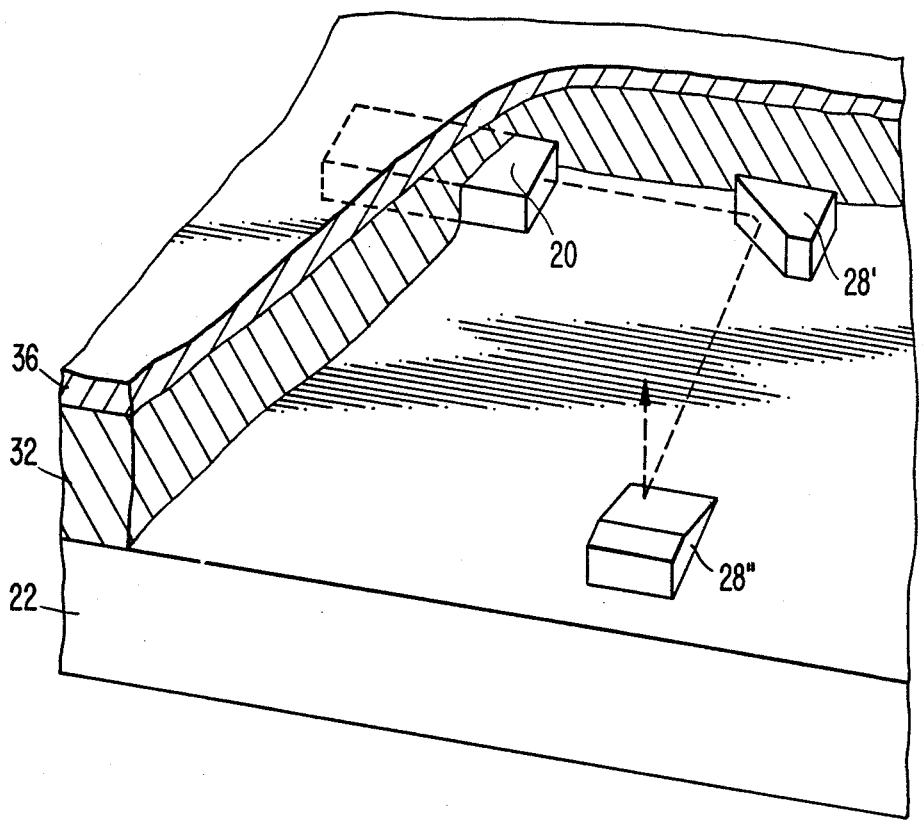
FIG. 6 is a perspective view of an embodiment of the invention where the light of the laser is first reflected parallel to the substrate surface before being reflected to the surface of the laser array.

A perspective view of yet another embodiment of the present invention is shown in FIG. 6. An internal reflector 28' is fabricated so that its 45° slanted surface is orthogonal to the surface of the substrate 22 and the laser beam travels in the high index material 32 parallel to the surface of the substrate 22. A second internal reflector 28" is placed in the laser beam path to reflect light to the laser array surface 38 at the desired point. This embodiment of the invention is useful for optoelectronic chips in which light is processed on the laser array surface.

While several embodiments of the invention, together with modifications thereof, have been described in detail herein and illustrated in the accompanying drawings, it will be evident that various further modifications are possible without departing from the scope of the invention. For example, although all illustrative embodiments portrayed semiconductor lasers, semiconductor LEDs could also be used in accordance with the present invention. Semiconductor LEDs are similar in comparison to semiconductor lasers, the main differences being in the lack of a resonating chamber and a less exacting criteria in the doping of the various semiconductor layers in an LED. In addition, photodetectors can be integrated into the array to receive the light from the laser deflected along the surface of the semiconductor substrate in the embodiment shown in FIG.

6, replacing the second internal reflector 28" for a photodetector.

What is claimed is:

1. A semiconductor laser element comprising:
   a semiconductor laser formed by sequential epitaxial layers of semiconductor material disposed on a semiconductor substrate so that light produced by said semiconductor laser is emitted in a direction substantially parallel to said semiconductor substrate;
   an internal reflector composed of a low index material having a slanted surface, said internal reflector disposed on said semiconductor substrate adjacent to said semiconductor laser and positioned to deflect light emitted from said laser on said slanted surface;
   a high index material disposed on and embedding both said semiconductor laser and said internal reflector so that light emitted from said semiconductor laser enters said high index material before striking said slanted surface;
   wherein the indexes of refraction of said low index and said high index material are chosen so that all of the light emitted by said laser striking said slanted surface of said internal reflector is deflected back into said high index material at an angle equal to the angle of incidence.

2. The semiconductor laser element as recited in claim 1 wherein said slanting surface is at a 45 degree angle from said surface of said semiconductor substrate and said light is emitted substantially perpendicular from the surface of said semiconductor substrate.

3. The semiconductor laser element as recited in claim 1 which further comprises an antireflective layer of material deposited on at least one end of said semiconductor laser of a thickness equal to a half wavelength of said light emitted from said laser to form an emitting laser mirror of the resonant cavity of said laser.

4. The semiconductor laser element as recited in claim 1 which further comprises an antireflective layer disposed on said high index material to reduce Fresnel losses from said semiconductor laser element.

5. The semiconductor laser element as recited in claim 2 wherein said slanting surface is curved to focus said light emitted from said laser element.

6. A semiconductor laser array comprising:
   a plurality of semiconductor lasers formed by sequential epitaxial layers of semiconductor material disposed on a semiconductor substrate so that light produced by each of said plurality of semiconductor lasers is emitted in a direction substantially parallel to said semiconductor substrate;
   a plurality of internal reflectors composed of a low index material, each of said plurality of internal reflectors having a slanted surface, each of said internal reflectors corresponding to a respective semiconductor laser and disposed on said semiconductor substrate adjacent to said respective semiconductor laser positioned to deflect light emitted from said respective laser on said slanted surface;
   a high index material disposed on and embedding both said plurality of said semiconductor lasers and said plurality of said internal reflectors so that light emitted from each of said plurality of semiconductor lasers enters said high index material before striking said slanted surface;
   wherein the indexes of refraction of said low index and said high index material are chosen so that all of the light striking said slanted surfaces of each of said plurality of internal reflectors is deflected back into said high index material at an angle equal to the angle of incidence.

7. The semiconductor laser array as recited in claim 6 wherein said slanting surfaces are at a 45 degree angle from said surface of said semiconductor substrate and said light is emitted substantially perpendicular from the surface of said semiconductor array.

8. The semiconductor laser array as recited in claim 6 which further comprises a conformal layer of material deposited on at least one end of said plurality of semiconductor lasers of a thickness equal to a half wavelength of said light emitted from said semiconductor lasers to form laser mirrors of the resonant cavities of said semiconductor lasers.

9. The semiconductor laser array as recited in claim 6 which further comprises an antireflective layer disposed on said high index material to reduce Fresnel losses from said semiconductor laser array.

10. The semiconductor laser array as recited in claim 7 wherein said slanting surfaces are curved to focus said light emitted from said plurality of semiconductor lasers.

11. A semiconductor laser element comprising:
    a semiconductor laser formed by sequential epitaxial layers of semiconductor material disposed on a semiconductor substrate so that light produced by said semiconductor laser is emitted in a direction substantially parallel to said semiconductor substrate;
    two internal reflectors composed of a low index material each having a slanted surface, said internal reflectors disposed on said semiconductor substrate at either end of and adjacent to said semiconductor laser and positioned to deflect light emitted from said laser on said slanted surfaces;
    a high index material disposed on and embedding both said semiconductor laser and said internal reflectors so that light emitted from said semiconductor laser enters said high index material before striking said slanted surface;
    wherein the indexes of refraction of said low index and said high index material are chosen so that all of the light emitted by said laser striking each said slanted surface of said internal reflectors is deflected back into said high index material at an angle equal to the angle of incidence.

12. The semiconductor laser element as recited in claim 11 wherein said slanting surfaces are at a 45 degree angle from said surface of said semiconductor substrate and said light is emitted substantially perpendicular from the surface of said semiconductor substrate.

13. The semiconductor laser element as recited in claim 11 which further comprises an antireflective layer of material deposited on at least one end of said semiconductor laser of a thickness equal to a half wavelength of said light emitted from said laser to form an emitting laser mirror of the resonant cavity of said laser.

14. The semiconductor laser element as recited in claim 11 which further comprises an antireflective layer disposed on said high index material to reduce Fresnel losses from said semiconductor laser element.

15. The semiconductor laser element as recited in claim 12 wherein said slanting surface is curved to focus said light emitted from said laser element.

16. The semiconductor laser element as recited in claim 1, wherein said slanting surface is at a 90° angle from said surface of said semiconductor substrate and said reflected light is directed substantially parallel along the surface of said semiconductor substrate.

17. The semiconductor laser element as recited in claim 16 wherein a photodetector disposed on said semiconductor substrate receives said reflected light from said slanting surface of said internal reflector.

18. The semiconductor laser array as recited in claim 1, wherein said slanting surfaces are at 90° angles from said surface of said semiconductor substrate and said reflected light is directed substantially parallel along the surface of said semiconductor substrate.

19. The semiconductor laser array as recited in claim 18 wherein photodetectors disposed on said semiconductor substrate receive said reflected light from said slanting surfaces of said internal reflectors.

20. A semiconductor light emitting element comprising:
a semiconductor light emitting element formed by sequential layers of semiconductor material disposed on a semiconductor substrate so that light produced by said semiconductor light emitting element is emitted in a direction substantially parallel to said semiconductor substrate;
an internal reflector composed of a low index material having a slanted surface, said internal reflector disposed on said semiconductor substrate adjacent to said semiconductor light emitting element and positioned to deflect light emitted from said light emitting element on said slanted surface;
a high index material disposed on and embedding both said semiconductor light emitting element and said internal reflector so that light emitted from said semiconductor light emitting element enters said high index material before striking said slanted surface;
wherein the indexes of refraction of said low index and said high index material are chosen so that all of the light emitted by said light emitting element striking said slanted surface of said internal reflector is deflected back into said high index material at an angle equal to the angle of incidence.

21. The semiconductor light emitting element as recited in claim 20 wherein said slanting surface is at a 45 degree angle from said surface of said semiconductor substrate and said light is emitted substantially perpendicular from the surface of said semiconductor substrate.

22. The semiconductor light emitting element as recited in claim 16 which further comprises an antireflective layer disposed on said high index material to reduce Fresnel losses.

23. The semiconductor light emitting element as recited in claim 20 wherein said slanting surface is curved to focus said light emitted from said light emitting element.

24. The semiconductor light emitting element as recited in claim 20 which further comprises a second internal reflector disposed on said semiconductor substrate adjacent to said semiconductor light element and positioned to deflect light emitted from said semiconductor light element on said slanted surface.

25. The semiconductor light emitting element as recited in claim 20 wherein said slanting surface is at a 90 degree angle from said surface of said semiconductor substrate and said reflected light is directed substantially parallel along the surface of said semiconductor substrate.

26. The semiconductor light emitting element as recited in claim 25 wherein a photodetector disposed on said semiconductor substrate receives said reflected light from said slanting surface of said internal reflector.

* * * * *